US010699633B2

(12) United States Patent
Li et al.

(10) Patent No.: US 10,699,633 B2
(45) Date of Patent: Jun. 30, 2020

(54) DISPLAY PANEL AND DISPLAY DEVICE

(71) Applicant: Shanghai Tianma AM-OLED Co., Ltd., Shanghai (CN)

(72) Inventors: Yue Li, Shanghai (CN); Xingyao Zhou, Shanghai (CN); Kaihong Huang, Shanghai (CN); Min Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/423,449

(22) Filed: May 28, 2019

(65) Prior Publication Data

US 2020/0152120 A1 May 14, 2020

(30) Foreign Application Priority Data

Nov. 8, 2018 (CN) .......................... 2018 1 1325088

(51) Int. Cl.
*H01L 27/12* (2006.01)
*G09G 3/3225* (2016.01)
*G09G 3/20* (2006.01)
*G09G 3/3275* (2016.01)

(52) U.S. Cl.
CPC ......... *G09G 3/3225* (2013.01); *G09G 3/2003* (2013.01); *G09G 3/3275* (2013.01); *G09G 2300/0426* (2013.01)

(58) Field of Classification Search
CPC .......... G09G 3/36; G09G 3/20; G02F 1/1362; H01L 27/12; H01L 27/02
See application file for complete search history.

(56) References Cited

U.S. PATENT DOCUMENTS

2016/0187750 A1* 6/2016 Tang ................. G02F 1/136259
349/42

FOREIGN PATENT DOCUMENTS

CN 1573892 A 2/2005
CN 108493226 A 9/2018

OTHER PUBLICATIONS

Chinese Office Action dated Apr. 7, 2020 for corresponding CM Application No. 201811325088.9, and English translation thereof.

* cited by examiner

*Primary Examiner* — Michael A Faragalla
(74) *Attorney, Agent, or Firm* — Tarolli, Sundheim, Covell & Tummino LLP

(57) ABSTRACT

A display panel is provided, having a display area, a fan-out area at periphery of the display area, and a binding area located at a side of the fan-out area away from the display area. The display panel includes: first, second and third short-circuiting bars located in the fan-out/binding area and extending along a first direction; and a first power line extending along a second direction intersecting with the first direction. The first power line extends from the binding area passing through the fan-out area to the display area, and is configured to provide a first power signal to a display unit in the display area. The first, second, third short-circuiting bars, and the first power line are located in a first metal layer, and at least one of the first, second, third short-circuiting bars is insulated from and does not intersect with the first power line.

19 Claims, 5 Drawing Sheets

DISPLAY PANEL AND DISPLAY DEVICE

CROSS-REFERENCE TO RELATED APPLICATIONS

The present application claims priority to Chinese Patent Application No. 201811325088.9, filed on Nov. 8, 2018, the content of which is incorporated herein by reference in its entirety.

TECHNICAL FIELD

The present disclosure relates to the field of display technologies, and in particular, to a display panel and a display device including the display panel.

BACKGROUND

With the continuous development of display technologies, consumers' requirements on display panels keep increasing, and various types of displayers appear and have been rapidly developed, such as liquid crystal display panels, organic light-emitting display panels and other display screens. Based on this, display technologies such as 3D display, touch display, curved display, ultra-high resolution display and peep-proof display constantly appear to meet the demands of the consumers.

Due to its advantages such as light weight, high contrast and flexible design, the organic light-emitting display panel has gradually become a mainstream product of the current display industry, which has attracted great favor from the consumers. After the organic light-emitting display panel is shipped from a factory, a visual test (VT test) is generally performed. During the VT test, the data signal lines of the display units displaying a same color light are short-circuited by a short-circuiting bar. Thereby, a monochrome image can be displayed. Generally, the short-circuiting bar is located in a fan-out area at the periphery of the display area, but traces in the fan-out area have a very dense distribution, and a power line for supplying a power signal to the display unit in the display area is included herein. The power line and the short-circuiting bar are located in a same layer. In order to achieve the monochrome display function of the short-circuiting bar without influencing normal transmission of the signal on the power line, how to arrange the power line and the short-circuiting bar to insulate the two and achieve their respective functions is an urgent problem to be solved in this field.

SUMMARY

In view of the above, the present disclosure provides a display panel, and a display device including the same, which insulate the short-circuiting bar from the power line, so that the two can achieve their respective functions without affecting normal operation of the display panel.

In an aspect, the present disclosure provides a display panel. The display panel has a display area, a fan-out area located at a periphery of the display area, and a binding area located at a side of the fan-out area facing away from the display area. The display panel includes: a first short-circuiting bar located in the fan-out area or the binding area and extending along a first direction; a second short-circuiting bar located in the fan-out area or the binding area and extending along the first direction; a third short-circuiting bar located in the fan-out area or the binding area and extending along the first direction; and at least one first power line extending along a second direction intersecting with the first direction. The at least one first power line extends from the binding area passing through the fan-out area to the display area, and is configured to provide a first power signal to a display unit in the display area. The first short-circuiting bar, the second short-circuiting bar, the third short-circuiting bar, and the at least one first power line are located in a first metal layer, and at least one of the first short-circuiting bar, the second short-circuiting bar and the third short-circuiting bar is insulated from the at least one first power line and does not intersect with the at least one first power line.

In another aspect, the present disclosure provides a display device, and the display device includes any display panel provided in the present disclosure.

DESCRIPTION OF EMBODIMENTS

In order to make the purposes, features and advantages of the present disclosure more understandable, the present disclosure will be further described with reference to the accompanying drawings and embodiments.

It should be noted that details are described as follows so as illustrate the present disclosure. However, the present disclosure can be implemented in various other ways than those described herein, and those skilled in the art can make similar promotion without departing from the scope of the present disclosure. The present disclosure is therefore not limited by the embodiments disclosed in the following.

Figure 1:
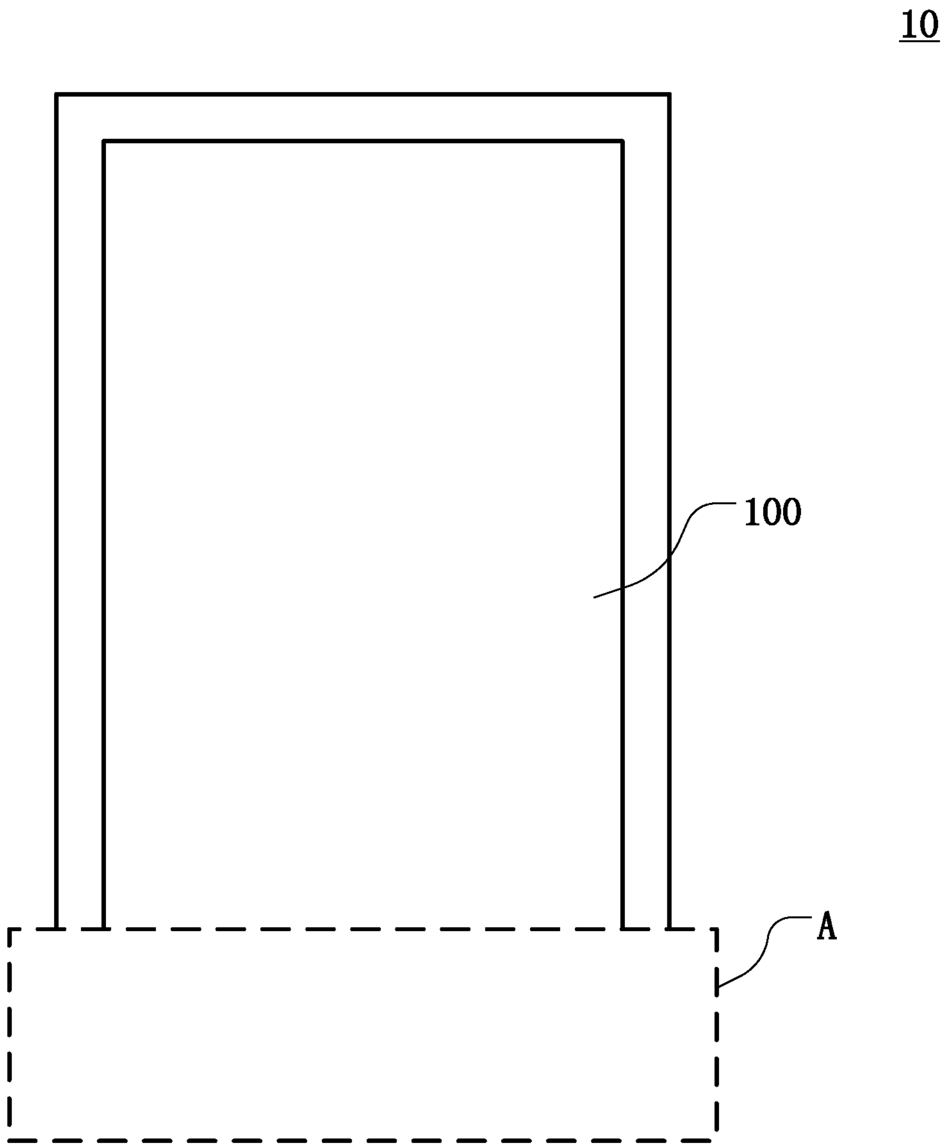
FIG. 1 is a schematic diagram of a display panel according to an embodiment of the present disclosure.
Figure 2:
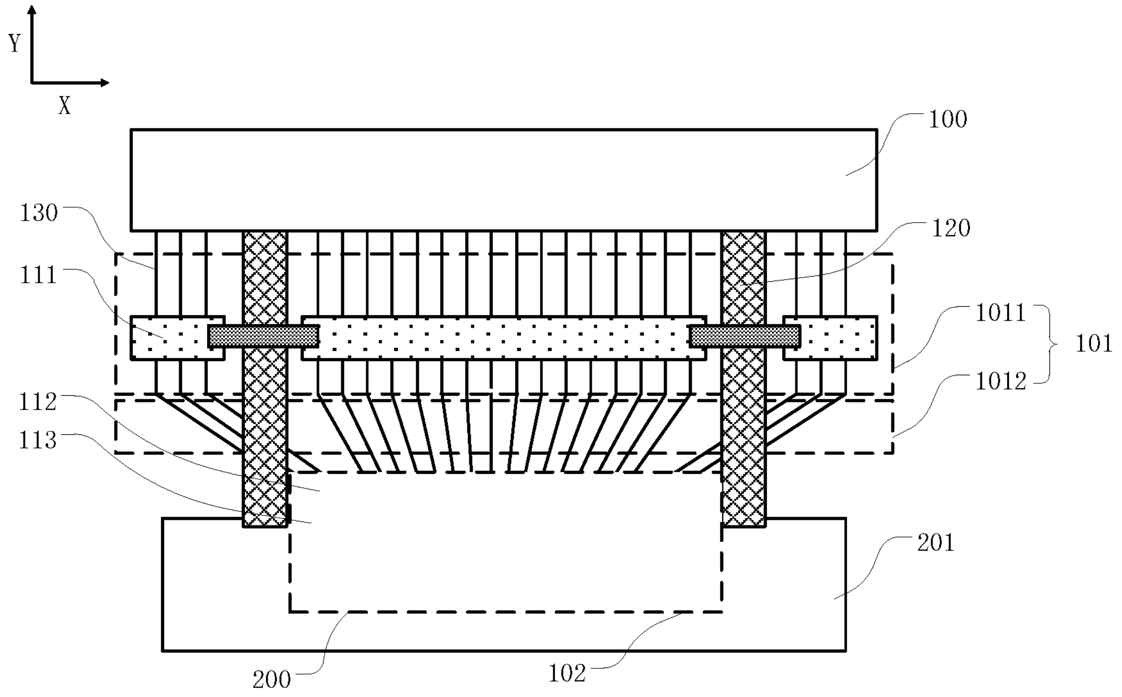
FIG. 2 is a partial schematic diagram of area A of the display panel of FIG. 1.

FIG. 1 is a schematic diagram of a display panel according to an embodiment of the present disclosure; and FIG. 2 is a partial schematic diagram of area A of the display panel of FIG. 1. As shown in FIG. 1 and FIG. 2, the display panel 10 has a display area 100, a fan-out area 101 located at the periphery of the display area 100, and a binding area 102 located at a side of the fan-out area 101 facing away from the display area 100. A first short-circuiting bar 111, a second short-circuiting bar 112, and a third short-circuiting bar 113 are located in the fan-out area 101 or the binding area 102, and each extend along a first direction X. A first power line 120 extends along a second direction Y. Herein, the first direction X intersects with the second direction Y As shown in FIG. 2, the first direction X is perpendicular to the second direction Y, and the first power line 120 extends from the binding area 201 passing through the fan-out area 101 to the display area 100, so as to provide a first power signal for display units in the display area 100. The first short-circuiting bar 111, the second short-circuiting bar 112, the third short-circuiting bar 113 and the first power line 120 are all located in a first metal layer. At least one of the first short-circuiting bar 112, the second short-circuiting bar 113, and the third short-circuiting bar 113 is insulated from and does not intersect with the first power source 120.

It should be noted that, in this embodiment, the short-circuiting bar is used to short-circuit the display units of a same color and lighten them at the same time, so as to test the visual effect under a monochrome image and check whether each display unit is able to display normally.

The display panel provided in this embodiment further includes a driving chip 200. Alternatively, as shown in FIG. 2, the driving chip 200 is located on a flexible circuit board 201. In other implementations of this embodiment, the driving chip may also be directly located on a substrate of the display panel 10, and the arrangement manner is determined according to specific conditions, which is not limited herein by the embodiments. The driving chip 200 provides a driving signal, such as a data signal, a gate driving signal, and the like, to the display unit in the display area 100. Moreover, the first power line 120 is also connected to the driving chip 200, thereby providing a first power signal to the display units in the display area.

In addition, the display panel 10 provided in this embodiment may be an organic light-emitting display panel, and the display units in the display area may be organic light-emitting elements. The basic structure of an organic light-emitting element is a cathode and an anode, and a light-emitting layer between the cathode and the anode. A certain voltage is applied to the anode and the cathode so as to generate a voltage difference that drives the organic light-emitting layer to emit light. In other embodiments, the display panel may also be another type of display panel, such as a quantum dot light-emitting display panel, a nano wafer light-emitting panel, etc., which is not limited herein by the embodiments.

In addition, it should be noted that the first short-circuiting bar 111, the second short-circuiting bar 112, the third short-circuiting bar 113, and the first power line 120 in this embodiment are all located in the first metal layer. The first metal layer may be located in a same layer as data lines in the display area. A material of the first metal layer may be a Ti/Al/Ti three-layer structure or other materials having a small resistivity, which is not limited herein by the embodiments.

It is known from the above description that, for the display panel provided by this embodiment, at least one of the first short-circuiting bar 111, the second short-circuiting bar 112, and the third short-circuiting bar 113 that are located in a same layer and each extend along the first direction is insulated from and does not intersect with the first power line 120 that extends along the second direction, thereby preventing the short-circuiting bar from intersecting with the first power line 120. In this way, it avoids cross-bridge or winding operations in the intersecting area, which may affect the resistance of the short-circuiting bar and lead to split screen due to uneven voltage drop on the short-circuiting bar during VT test, which affects the test result. In this way, the structure of the display panel is optimized, and the VT test effect is improved.

In this embodiment, as shown in FIG. 2, a signal trace 130 in the display area 100 is bound to the driving chip 200 in the binding area 102 after it extends through the fan-out area 101. The binding area 102 is located between two adjacent first power lines. The short-circuiting bar among the first short-circuiting bar 111, the second short-circuiting bar 112, and the third short-circuiting bar 113 that does not intersect with the first power line 120 is located in the binding area 102. Herein, the signal trace 130 may be a data line that extends from the display area to the fan-out area. The binding area 102 is an area where the signal trace 130 is bound to the driving chip 200, and therefore the traces in this area have a very dense distribution. The first power line 120 is lead out from the driving chip 200 and passes through the fan-out area 101 to reach the display area 100. In order to sufficiently transmit the first power signal to the display area 100, the first power line 120 has a large width. Therefore, the binding area 102 is arranged between two adjacent first power lines 120, so that it helps saving the area of the frame area and achieve sufficient binding of the signal trace 130. In this structure, if the short-circuiting bar is located in the binding area 102, it can prevent the short-circuiting bar from intersecting with the first power line 120, thereby avoiding a large resistance difference caused by the cross-bridge design.

Figure 3:
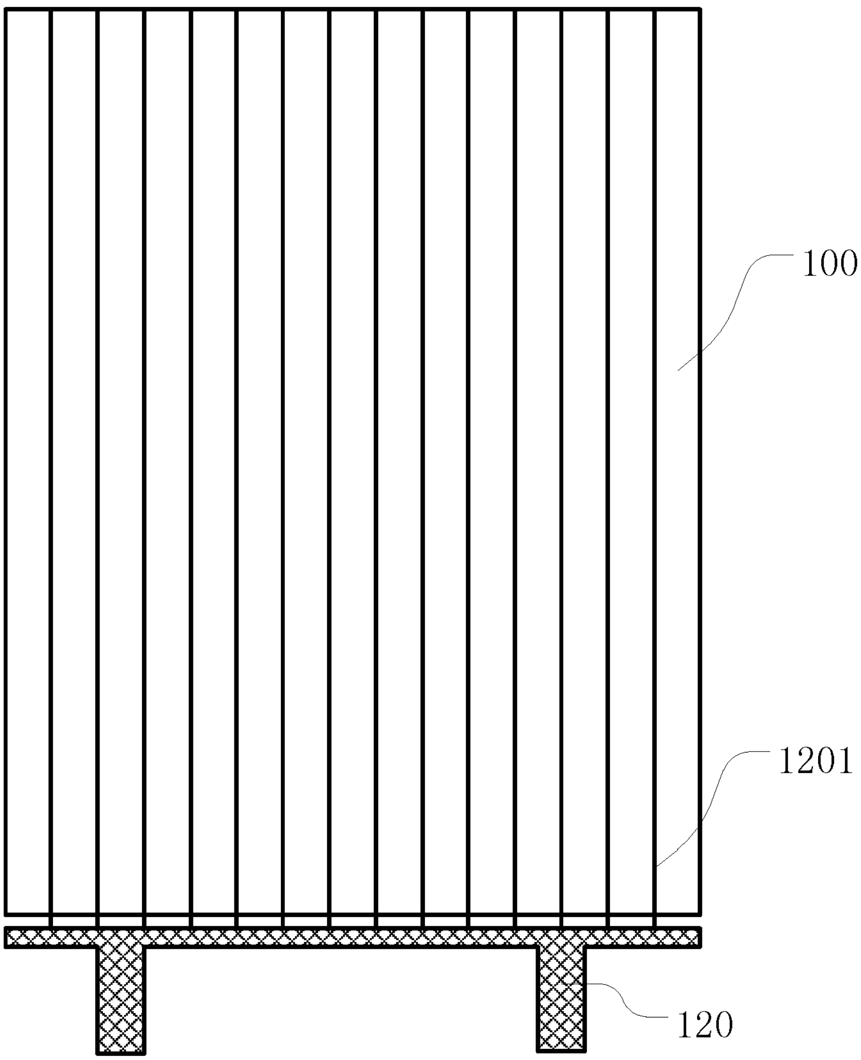
FIG. 3 is a schematic diagram of a first power line according to an embodiment of the present disclosure.

In this embodiment, with reference to FIG. 3, which is a schematic diagram of a first power line according to an embodiment of the present disclosure, the first power line 120 is a total input line of the first power signal, when the first power line 120 passes through the fan-out area 101 and reaches the display area 100, the first power line 120 is divided into a plurality of first power sub-lines 1201, and the plurality of first power sub-lines 1201 provides a first power signal for the display units in the display area 100. The first power signal may be a signal for supplying an anode voltage to the anode, and the first power signal is a positive voltage signal, such as +5V, +10V, and the like.

In an embodiment, it is possible that neither of the first short-circuiting bar 111, the second short-circuiting bar 112, and the third short-circuiting bar 113 intersects with the first power line 120, and all of the first short-circuiting bar 111, the second short-circuiting bar 112, and the third short-circuiting bar 113 are located in the binding area 102. This design can be used when the binding area 102 has a large area. However, in some cases, the binding area has a smaller area. When the binding area is not large enough to accommodate three short-circuiting bars, the following design can be adopted.

As shown in FIG. 2, the first short-circuiting bar 111 is located in the fan-out area 101, and the first short-circuiting bar 111 intersects with the first power line 120. In the intersecting area, the first short-circuiting bar 111 is continued by a first cross-bridge 300, and the first cross-bridge 300 is located in a second metal layer. The second metal layer may be located in a same layer as the gate line in the display area, or may be located between the data line and the gate line, or may be located above the data line. Moreover, a material of the second metal layer may be Mo or other materials, which is not limited herein by the embodiments.

Further, the second short-circuiting bar 112 and the third short-circuiting bar 113 are located in the binding area 102, and neither the second short-circuiting bar 112 nor the third short-circuiting bar 113 intersects with the first power line 120.

In this case, the first short-circuiting bar 111 can be located in the fan-out area 101, and the second short-circuiting bar 112 and the third short-circuiting bar 113 can be located in the binding area 102, thereby avoiding a situation in which the binding area is too small to accommodate three short-circuiting bars.

In the abovementioned design, the first short-circuiting bar 111 controls light emission of a green display unit in the display area, and the second short-circuiting bar 112 and the third short-circuiting bar 113 respectively control light emission of a red display unit and a blue display unit. The green light has a higher visual sensitivity in the human eyes, and the red light and the blue light has a lower visual sensitivity in the human eyes. Therefore, the green display unit has a relatively small area but can generate light with enough intensity, so that the driving voltage of the green display unit is small. Therefore, during the VT test, when a cross-bridge is designed due to the short-circuiting bar that controls the green display unit intersecting with the power line, changing of its resistance has a small influence on the lightening of the green display unit. Therefore, the first short-circuiting bar 111 can be designed as such. However, if the short-circuiting bar that controls the red display unit and the short-circuiting bar that controls the blue display unit are designed with a cross-bridge, an obvious split screen may happen. Therefore, the second short-circuiting bar 112 and the third short-circuiting bar 113 are arranged in the binding area 102, so as to avoid split screen.

Further, as shown in FIG. 2, the fan-out area 101 includes a first fan-out area 1011 and a second fan-out area 1012, and the second fan-out area 1012 is located between the first fan-out area 1011 and the binding area 102. In the second fan-out area 1012, a distance between adjacent signal traces 130 close to the binding area 102 is smaller than a distance between adjacent signal traces 130 close to the first fan-out area 1011. The first short-circuiting bar 111 is located in the first fan-out area 1011. It can be seen from FIG. 2 that when the signal trace 130 extends to the first fan-out area 1011 from the display area 100, it extends along the second direction Y, and the distance between adjacent signal traces 130 in the first fan-out area 1011 is large. Thereafter, the signal trace 130 extends to the second fan-out area 1012 and then extends inclined from the second direction Yin the second fan-out area 1012, and the distance between adjacent signal traces is gradually decreased. When the signal trace 130 passes through the second fan-out area 1012 and reaches the binding area 102, the distance between adjacent signal traces 130 becomes small, and the signal trace 130 is bonded to the driving chip 200 through a connection terminal on the driving chip. Since the distance between adjacent signal traces 130 in the first fan-out area 1011 is large, it is advantageous to connect the signal trace 130 to the first short-circuiting bar 1011 during the VT test, so as to achieve monochrome image display.

In an embodiment, the first cross-bridge has a larger resistivity than the first short-circuiting bar. Since the material of the first short-circuiting bar is usually a Ti/Al/Ti three-layer structure, the resistivity is relatively small, when it is switched to another metal layer through the across-bridge, the other metal layer has a larger resistivity than the first metal layer, and therefore, the resistivity of the first cross-bridge is larger than the that of the first short-circuiting bar. However, in other implementations of this embodiment, it is also possible that the resistivity of the first cross-bridge is smaller than that of the first short-circuiting bar, thereby improving the monochrome display effect during the VT test.

Figure 4:
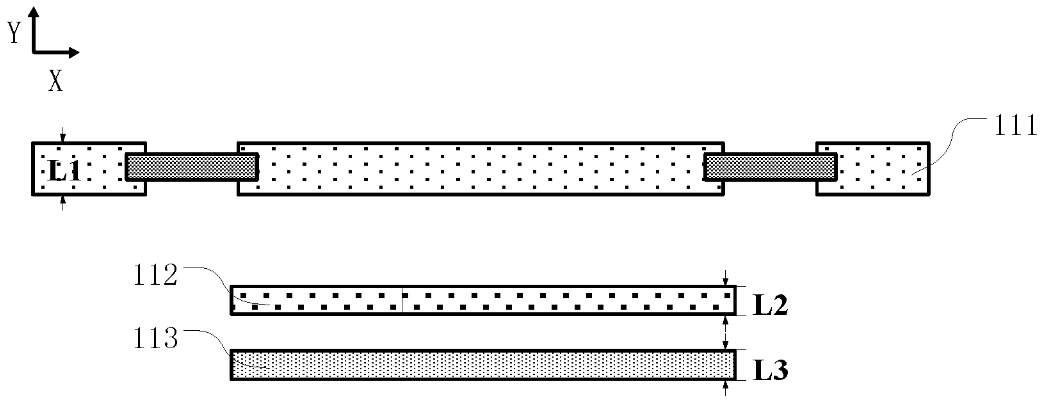
FIG. 4 is a structural schematic diagram of a short-circuiting bar according to an embodiment of the present disclosure.

FIG. 4 is a structural schematic diagram of a short-circuiting bar according to an embodiment of the present disclosure. In an embodiment, as shown in FIG. 4, a width L1 of the first short-circuiting bar 111 in the second direction Y is larger than a width L2 of the second short-circuiting bar 112 in the second direction Y, or larger than a width L3 of the third short-circuiting bar 113 in the second direction Y. Since the first short-circuiting bar 111 is located in the fan-out area 101 and has an intersecting area with the first power line 120, the first short-circuiting bar 111 is continued by the first cross-bridge 300. Generally, the first cross-bridge 300 has a larger resistivity than the first short-circuiting bar 111, so the cross-bridge design will increase the resistance of the first short-circuiting bar 111. Therefore, in order to achieve the VT test effect of the first short-circuiting bar 111, the width of the first short-circuiting bar 111 is set larger, so as to reduce the resistance of the first short-circuiting bar 111, while the second short-circuiting bar 112 and the third short-circuiting bar 113 do not need to be continued by a cross-bridge, so the width thereof does not need to be set large.

In addition, in other implementations of the embodiment, the width of the first short-circuiting bar 111, the width of the second short-circuiting bar 112, and the width of the third short-circuiting bar 113 have a same value in the second direction Y. When the short-circuiting bars corresponding to red color, green color, and blue color display units are not provided with a cross-bridge, since the green color has the highest visual sensitivity in the human eye, the green display unit can display a relatively strong light without the need of a large driving voltage. Therefore, the width of the short-circuiting bar corresponding to the green display unit is smaller than the width of each of the short-circuiting bars corresponding to the other color display units. When the first short-circuiting bar 111 has a cross-bridge and the other short-circuiting bars do not have a cross-bridge, the width of the first short-circuiting bar 111 may be appropriately increased, such that it is equal to the width of each of the other short-circuiting bars, thereby effectively balancing the resistance.

In addition, in an embodiment, as shown in FIG. 2, the display panel 10 includes two first power lines 120 located at two sides of the binding area 102. In other embodiments, the number of first power lines 120 may also be other cases according to actual needs, which is not limited herein by the embodiments.

In addition, the above situation is for the case where the first short-circuiting bar 111 is located in the fan-out area 101, and the second short-circuiting bar 112 and the third short-circuiting bar 113 are located in the binding area 102. When the space of the binding area 102 is small, it is possible that one of the second short-circuiting bar 112 and the third short-circuiting bar 113 is arranged in the binding area 102, and the other one is arranged in the fan-out area 101, thereby avoiding a dense distribution of the traces in the binding area 102.

Figure 5:
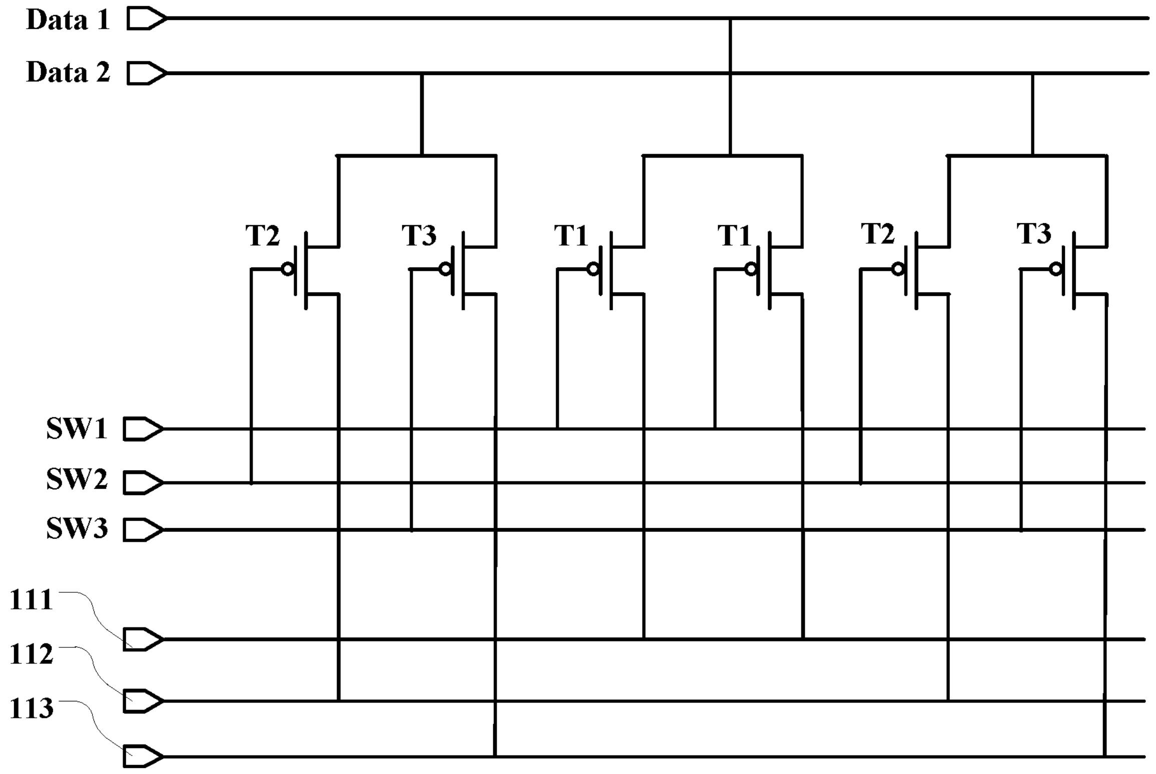
FIG. 5 is a schematic diagram of an overall structural of a short-circuiting bar according to an embodiment of the present disclosure.

In this embodiment, with reference to FIG. 5, which is a schematic diagram of an overall structural of a short-circuiting bar according to an embodiment of the present disclosure. The display panel 10 further includes a plurality of data lines extending along the second direction Y. A first transistor T1 is arranged between a part of the plurality of data lines and the first short-circuiting bar 111, a second transistor T2 is arranged between a part of the plurality of data lines and the second short-circuiting bar 112, and a third transistor T3 is arranged between a part of the plurality of data lines and the third short-circuiting bar 113. The display panel 10 further includes a first enable signal line SW1 extending along the first direction X, a second enable signal line SW2 extending along the first direction X, and a third enable signal line SW3 extending along the first direction X. The first enable signal line SW1 is configured to control on and off of a signal transmission between a part of the plurality of data lines and the first short-circuiting bar 111, the second enable signal line is configured to control on and off of a signal transmission between a part of the plurality of data lines and the second short-circuiting bar 112, and the third enable signal line is configured to control on and off of a signal transmission between a part of the plurality of data lines and the third short-circuiting bar 113.

As shown in FIG. 5, each of the first transistor T1, the second transistor T2, and the third transistor T3 may be a triode. The first enable signal line SW1 is connected to a gate electrode of the first transistor T1, the second enable signal line SW2 is connected to a gate electrode of the second transistor T2, and the third enable signal line SW3 is connected to a gate electrode of the third transistor T3.

Further, the plurality of data lines includes a first data line Data1 and a second data line Data2. The first data line Data1 is connected to the first short-circuiting bar 111 through the first transistor T1, the second data line Data2 is connected to the second short-circuiting bar 112 through the second transistor T2, or the second data line Data2 is connected to the third short-circuiting bar 113 through the third transistor T3. In this case, in the display area, the first data line Data1 may control the green display units, and the green display units are arranged in a column along the second direction Y, the second data line Data2 may control the blue display units or the red display units, and a red display unit and a blue display units are alternatively arranged in a column along the second direction.

When the display panel is during the VT test, the short-circuiting bar needs to be connected to the data line through a transistor, and all the display units displaying a same color are short-circuited together to display a monochrome image. The enable signal line and the short-circuiting bar may be located in a same layer, that is, both of them are located in the first metal layer, and the materials thereof are the same. Or, the enable signal line and the short-circuiting bar may be located in different layers, for example, the enable signal line is located in the same layer as the first cross-bridge, i.e., the second metal layer. The arrangement depends on the actual structure, and is not limited herein by the embodiments.

Further, at least one of the first enable signal line SW1, the second enable signal line SW2, and the third enable signal line SW3 is insulated from and does not intersect with the first power line 120. Since the first enable signal line SW1, the second enable signal line SW2, and the third enable signal line SW3 each extend along the first direction X, if the enable signal line intersects with the first power line 120, the signal line needs to be provided with a cross-bridge. In this case, during the VT test, the resistance of the signal line is relatively large, thereby leading to response delay and split screen, which may cause misjudgment of the VT test result and thus not conducive to the improvement of the yield. Therefore, it is necessary to make the enable signal line not intersect with the second power line 120, thereby avoiding the above problem and achieving the effect of the VT test.

Further, the enable signal line among the first enable signal line SW1, the second enable signal line SW2, and the third enable signal line SW3 that does not intersect with the first power line 120 is located in the binding area 102. As described above, since the binding area 102 is located between two adjacent first power lines 120, the enable signal line that does not intersect with the first power line 120 is located in the binding area 102, thereby effectively avoiding the problem of intersecting with the first power line 120.

In an embodiment, as described above, a display stage of the display panel 10 includes a visual test stage, i.e., a VT test stage, and the first transistor T1 or the second transistor T2 or the third transistor T3 is turned on only during the VT test stage. During other display stages, the abovementioned transistors are all turned off. The short-circuiting bar is only turned on during the VT test stage, so that the display panel displays a monochrome image, thereby checking whether the display unit of each color is able to display normally. The short-circuiting bar is not in operation during the normal display stage of the display panel, and thus each transistor is turned off.

Another aspect of the present disclosure further provides a display device including the display panel described in any of the above embodiments.

Figure 6:
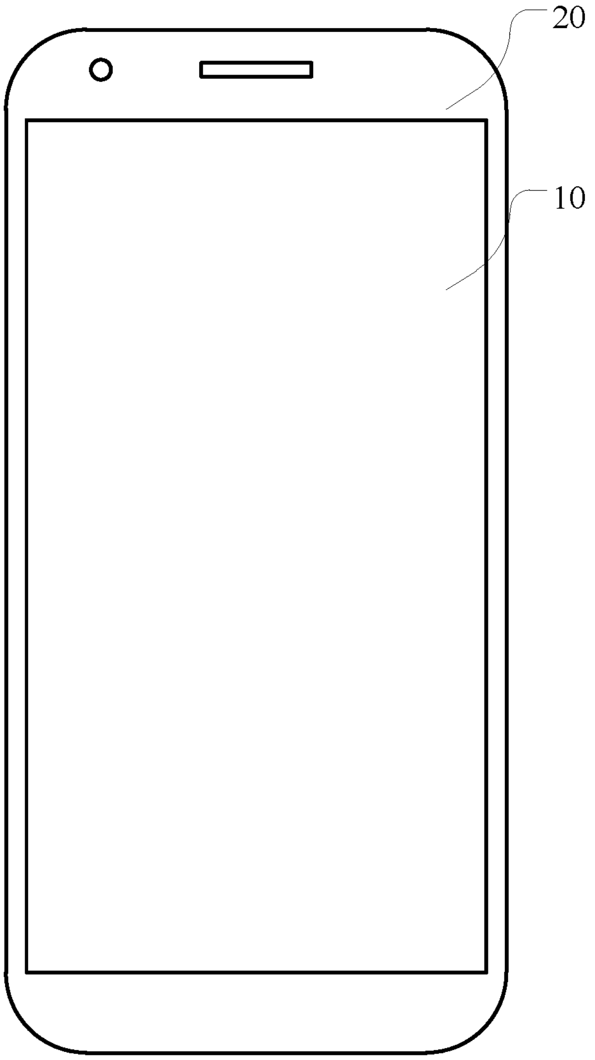
FIG. 6 is a schematic diagram of a display device according to an embodiment of the present disclosure.

FIG. 6 is a schematic diagram of a display device according to an embodiment. As shown in FIG. 6, the display device 20 includes a display panel 10, which is a display panel described in any of the above embodiments. The display device 20 can be a television, a laptop computer, a cellphone, a smart wearable display device, etc., and can also be other types of display devices, which is not limited herein by the embodiments.

It is known from the above description that, for the display panel and display device provided by the embodiments, at least one of the first short-circuiting bar 111, the second short-circuiting bar 112, and the third short-circuiting bar 113 that are located in a same layer and each extend along the first direction is insulated from and does not intersect with the first power line 120 extending along the second direction, thereby preventing the short-circuiting bar from intersecting with the first power line 120. In this way, it avoids cross-bridge or winding operations in the intersecting area, which may affect the resistance of the short-circuiting bar and lead to split screen due to uneven voltage drop on the short-circuiting bar during VT test, which affects the test result. In this way, the structure of the display panel is optimized, and the VT test effect is improved.

The above is merely a further description of the present disclosure in connection with preferred embodiments, which shall not limit the present disclosure. Those skilled in the art may make some simple deductions or substitutions without departing from the concept of the present disclosure, but these deductions or substitutions should shall fall into the protection scope of the present disclosure.

What is claimed is:

1. A display panel, including a display area, a fan-out area located at a periphery of the display area, and a binding area located at a side of the fan-out area facing away from the display area, wherein the display panel comprises:

a first short-circuiting bar located in the fan-out area or the binding area and extending along a first direction;

a second short-circuiting bar located in the fan-out area or the binding area and extending along the first direction;

a third short-circuiting bar located in the fan-out area or the binding area and extending along the first direction; and at least one first power line extending along a second direction intersecting with the first direction, wherein the at least one first power line extends from the binding area passing through the fan-out area to the display area, and is configured to provide a first power signal to a display unit in the display area, and wherein the first short-circuiting bar, the second short-circuiting bar, the third short-circuiting bar, and the at least one first power line are located in a first metal layer, and at least one of the first short-circuiting bar, the second short-circuiting bar and the third short-circuiting bar is insulated from the at least one first power line and does not intersect with the at least one first power line.

2. The display panel according to claim 1, wherein a signal trace of the display area extends through the fan-out area to be bound to a driving chip in the binding area, and the binding area is arranged between two adjacent first power lines of the at least one first power line, wherein the at least one first power line comprises at least two first power lines.

3. The display panel according to claim 2, wherein at least one of the first short-circuiting bar, the second short-circuiting bar, and the third short-circuiting bar that does not intersect with the at least one first power line is located in the binding area.

4. The display panel according to claim 1, wherein the at least one first power line divides into a plurality of first power sub-lines after passing through the fan-out area from the binding area, and the plurality of first power sub-lines each provides a first power signal to the display unit in the display area.

5. The display panel according to claim 1, wherein the first short-circuiting bar is located in the fan-out area and intersects with the at least one first power line, the first short-circuiting bar is connected by a first cross-bridge at an intersecting area where the first short-circuiting bar intersects with the at least one first power line, and the first cross-bridge is located in a second metal layer.

6. The display panel according to claim 5, wherein the second short-circuiting bar and the third short-circuiting bar are located in the binding area, and neither the second short-circuiting bar nor the third short-circuiting bar intersects with the at least one first power line.

7. The display panel according to claim 5, wherein the first short-circuiting bar is configured to control a green display unit in the display area, the second short-circuiting bar is configured to control a red display unit, and the third short-circuiting bar is configured to control a blue display unit.

8. The display panel according to claim 5, wherein the fan-out area comprises a first fan-out area and a second fan-out area, and the second fan-out area is located between the first fan-out area and the binding area; in the second fan-out area, a spacing between adjacent signal traces extended from the display area and close to the binding area is smaller than a spacing between adjacent signal traces extended from the display area and close to the first fan-out area; and the first short-circuiting bar is located in the first fan-out area.

9. The display panel according to claim 5, wherein the first cross-bridge has a resistivity larger than a resistivity of the first short-circuiting bar.

10. The display panel according to claim 5, wherein the first short-circuiting bar has a width in the second direction larger than a width of the second short-circuiting bar in the second direction or larger than a width of the third short-circuiting bar in the second direction.

11. The display panel according to claim 5, wherein the first short-circuiting bar, the second short-circuiting bar and the third short-circuiting bar have an equivalent width in the second direction.

12. The display panel according to claim 1, wherein the at least one first power line comprises two first power lines.

13. The display panel according to claim 1, further comprising:

a plurality of data lines each extending along the second direction;

a first transistor arranged between a part of the plurality of data lines and the first short-circuiting bar;

a second transistor arranged between a part of the plurality of data lines and the second short-circuiting bar;

a third transistor arranged between a part of the plurality of data lines and the third short-circuiting bar;

a first enable signal line extending along the first direction and configured to control on and off of signal transmission between a part of the plurality of data lines and the first short-circuiting bar;

a second enable signal line extending along the first direction and configured to control on and off of signal transmission between a part of the plurality of data lines and the second short-circuiting bar; and a third enable signal line extending along the first direction and configured to control on and off of signal transmission between a part of the plurality of data lines and the third short-circuiting bar.

14. The display panel according to claim 13, wherein the first enable signal line is connected to a gate electrode of the first transistor, the second enable signal line is connected to a gate electrode of the second transistor, and the third enable signal line is connected to a gate electrode of the third transistor.

15. The display panel according to claim 13, wherein the plurality of data lines comprises a first data line and a second data line, the first data line is connected to the first short-circuiting bar through the first transistor, and the second data line is connected to the second short-circuiting bar through the second transistor or connected to the third short-circuiting bar through the third transistor.

16. The display panel according to claim 13, wherein at least one of the first enable signal line, the second enable signal line and the third enable signal line is insulated from the at least one first power line and does not intersect with the at least one first power line.

17. The display panel according to claim 13, wherein one of the first enable signal line, the second enable signal line and the third enable signal line that does not intersect with the at least one first power line is located in the binding area.

18. The display panel according to claim 13, wherein a display stage of the display panel comprises a visual test stage, and the first transistor, the second transistor or the third transistor is turned on only during the visual test stage.

19. A display device, comprising a display panel, the display panel including a display area, a fan-out area located at a periphery of the display area, and a binding area located at a side of the fan-out area facing away from the display area, wherein the display panel comprises:

a first short-circuiting bar located in the fan-out area or the binding area and extending along a first direction;

a second short-circuiting bar located in the fan-out area or the binding area and extending along the first direction;

a third short-circuiting bar located in the fan-out area or the binding area and extending along the first direction; and at least one first power line extending along a second direction intersecting with the first direction, wherein the at least one first power line extends from the binding area passing through the fan-out area to the display area, and is configured to provide a first power signal to a display unit in the display area, and wherein the first short-circuiting bar, the second short-circuiting bar, the third short-circuiting bar, and the at least one first power line are located in a first metal layer, and at least one of the first short-circuiting bar, the second short-circuiting bar and the third short-circuiting bar is insulated from the at least one first power line and does not intersect with the at least one first power line.

* * * * *